United States Patent [19]
Bosshart

[11] Patent Number: 6,078,634
[45] Date of Patent: Jun. 20, 2000

[54] PHASE-LOCKED LOOP CIRCUIT WITH A MULTI-CYCLE PHASE DETECTOR AND MULTI-CURRENT CHARGE PUMP

[75] Inventor: Patrick W. Bosshart, Plano, Tex.

[73] Assignee: Texas Instruments Incorporated, Dallas, Tex.

[21] Appl. No.: 08/134,147

[22] Filed: Oct. 8, 1993

[51] Int. Cl.[7] ...................................................... H03D 3/24
[52] U.S. Cl. .......................... 375/376; 331/1 A; 331/10; 331/11; 455/260
[58] Field of Search ..................................... 375/120, 373, 375/375, 376, 325, 327; 331/1 A, 1 R, 10, 14, 17, 25, 325, 11; 455/260

[56] References Cited

U.S. PATENT DOCUMENTS

| | | |
|---|---|---|
| 5,239,561 | 8/1993 | Wong et al. ............................. 375/120 |
| 5,271,040 | 12/1993 | Clark ....................................... 375/120 |
| 5,278,702 | 1/1994 | Wilson et al. ........................... 375/120 |
| 5,278,874 | 1/1994 | Liu et al. ................................. 375/120 |
| 5,285,483 | 2/1994 | Ogawa et al. .......................... 375/120 |
| 5,313,499 | 5/1994 | Coburn .................................... 375/120 |
| 5,334,951 | 8/1994 | Hogeboom .............................. 331/1 A |

*Primary Examiner*—Edward F. Urban
*Assistant Examiner*—Congvan Tran
*Attorney, Agent, or Firm*—J. Dennis Moore; Wade James Brady, III; Frederick J. Telecky, Jr.

[57] ABSTRACT

A phase-locked loop circuit for locking the phase of an oscillator to the phase of a reference signal includes a multi-cycle phase detector (11) for detecting a phase difference between an input signal and said reference signal through multiple clock cycles and for sending a corresponding phase adjustment signal, and, a multiple current source charge pump (12) connecting to said phase detector for receiving said phase adjustment signal and sending a current signal depending upon said phase adjustment signal.

11 Claims, 5 Drawing Sheets

PHASE-LOCKED LOOP CIRCUIT WITH A MULTI-CYCLE PHASE DETECTOR AND MULTI-CURRENT CHARGE PUMP

Copyright©, Texas Instruments Incorporated, 1993. A portion of the Disclosure of this patent document contains material which is subject to copyright protection. The copyright owner has no objection to facsimile reproduction by anyone of the patent document or the patent disclosure, as it appears in the U.S. Patent and Trademark Office, patent file or records, but otherwise reserves all rights in its copyright whatsoever.

TECHNICAL FIELD OF THE INVENTION

This invention relates to a phase-locked loop circuit in a data processing system and more specifically to an improved phase-locked loop circuit with multi-cycle phase detection and multi-current charge pump capability.

BACKGROUND OF THE INVENTION

Phase-locked loop circuit (PLL's) are feedback circuits with a certain gain-bandwidth product. In simplified form, that gain-bandwidth product is typically the charge pump and loop filter gain times the VCO gain. The gain can be straightforwardly set to any desired value typically by setting the magnitude of a current source which drives the charge pump and loop filter. Practically speaking, there is a maximum allowed value for the gain-bandwidth product, and therefore the current source, which is related to the lowest input clock frequency which the PLL wants to lock to.

One operation required of a PLL is acquisition. When the PLL is first powered up, the output control voltage of the loop filter may be zero, and therefore the VCO will not oscillate at all. Then the PLL is powered on, and a 50 MHz input clock (for example) is presented to the phase detector. The phase detector and charge pump must slew the output voltage of the loop filter upwards to a sufficient value so that the VCO oscillates at the correct frequency. The time it takes to do this is partially determined by the setting of the magnitude of the current source reference for the charge pump. The smaller the current source, the longer the acquisition time. It is desired to increase the value of this current source to minimize acquisition time, but there are limits to this, as described in the paragraph above, since the gain-bandwidth product of the PLL is directly proportional to the value of the current source, and the allowable gain-bandwidth product is limited.

A circuit which could get around these limits would be a useful feature in a PLL, because it could reduce the acquisition time, while not disturbing the PLL's gain-bandwidth product.

According to one aspect of the present invention a phase-locked loop is provided that includes a multi-cycle phase detector that detects the phase difference between an input signal and a reference signal and provides an output signal representative thereof. The output signal is updated at least every cycle of the reference signal. A control circuit receives the output signal and generates a control signal for a voltage controlled oscillator (VCO) in response thereto. The control signal is applied to a VCO, and the output of the VCO is applied to the multi-cycle phase detector as the input signal thereof that is compared against the reference signal.

According to another aspect of the present invention, a phase-locked loop is provided that includes a phase detector that detects the phase difference between an input signal and a reference signal and provides a first output signal representative of a phase difference less than a single cycle and a second output signal representative of a phase difference greater than a single cycle. A control circuit receives the first and second output signals and provides a VCO control signal responsive to those two output signals.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION OF THE INVENTION

Referring generally to FIGS. 2–7, the preferred embodiment of the present invention depicts a portion of a phase-locked loop (depicted in FIG. 8) for locking the phase of an oscillator to the phase of a reference signal. The phase-locked loop includes a multi-cycle phase detector 11, a charge pump 12, and a loop filter 13. The multi-cycle phase detector 11 detects a phase difference between a reference clock signal PLL-IN provided from an off-chip source, such as a crystal oscillator, and OUT1XB, generated clock signal 3 which is fed back from the VCO (FIG. 8) through multiple clock cycles.

Figures 6, 7:
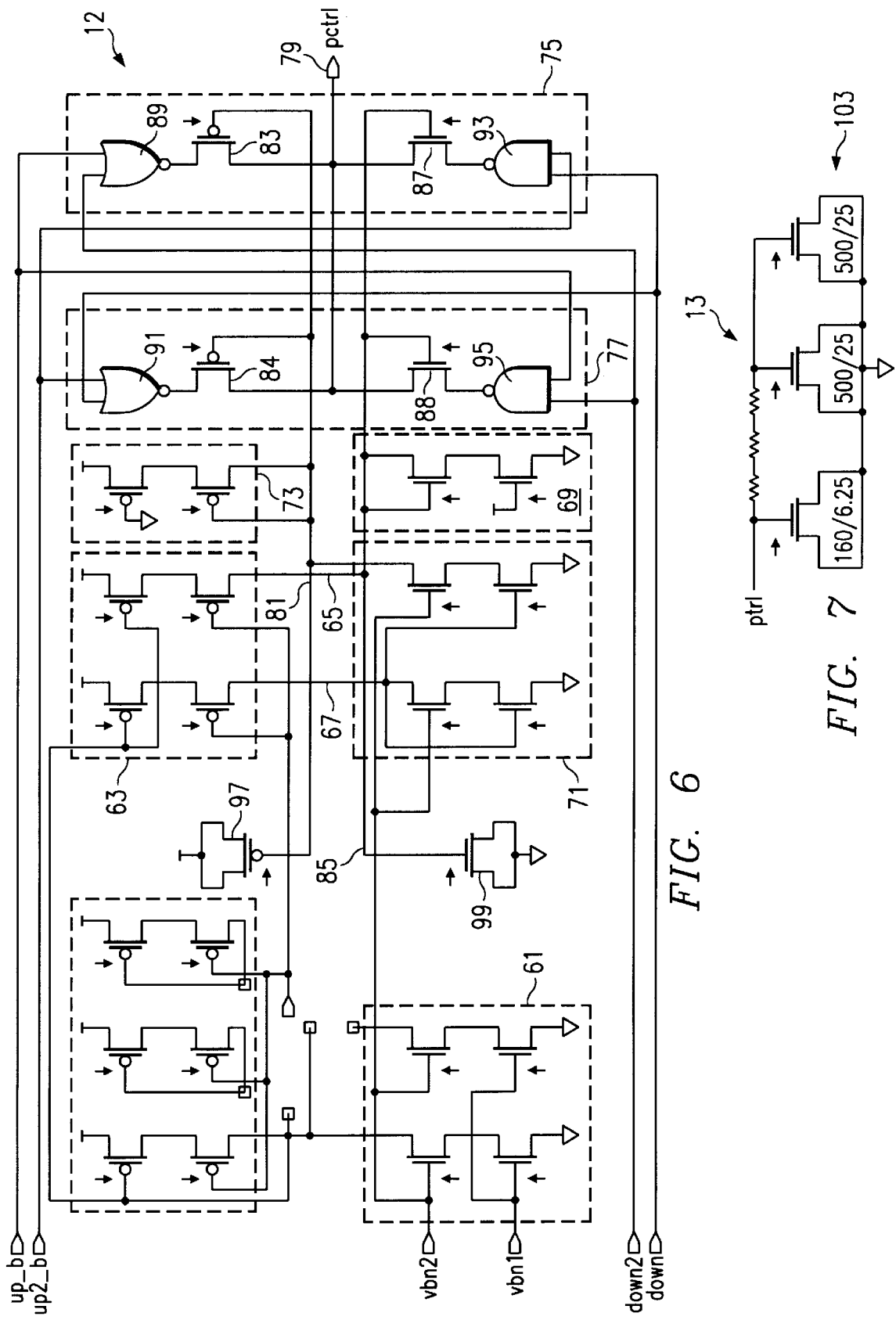
FIG. 6 is a schematic of the charge pump of the preferred embodiment.
FIG. 7 is a schematic of the loop filter of the preferred embodiment.

The charge pump 12 connects to the phase detector 11 and provides output current pulses at node PCTRL (FIG. 6) to increase or decrease the output voltage at the loop filter 13 (FIG. 7).

The loop filter 13 connects to the charge pump 12 and translates the current pulses at node PCTRL to a desired voltage level as determined by the magnitude of the current pulses.

The phase detector 11 sends phase adjustment signals to the charge pump 12 which are single and two-cycle, up/down, pulse-width modulated, digital control signals up-B, down, UP2-B, DOWN2.

The charge pump receives the adjustment signals and a dc bias voltage signal and sends a corresponding output current pulse signal to the loop filter 13.

Figure 2:
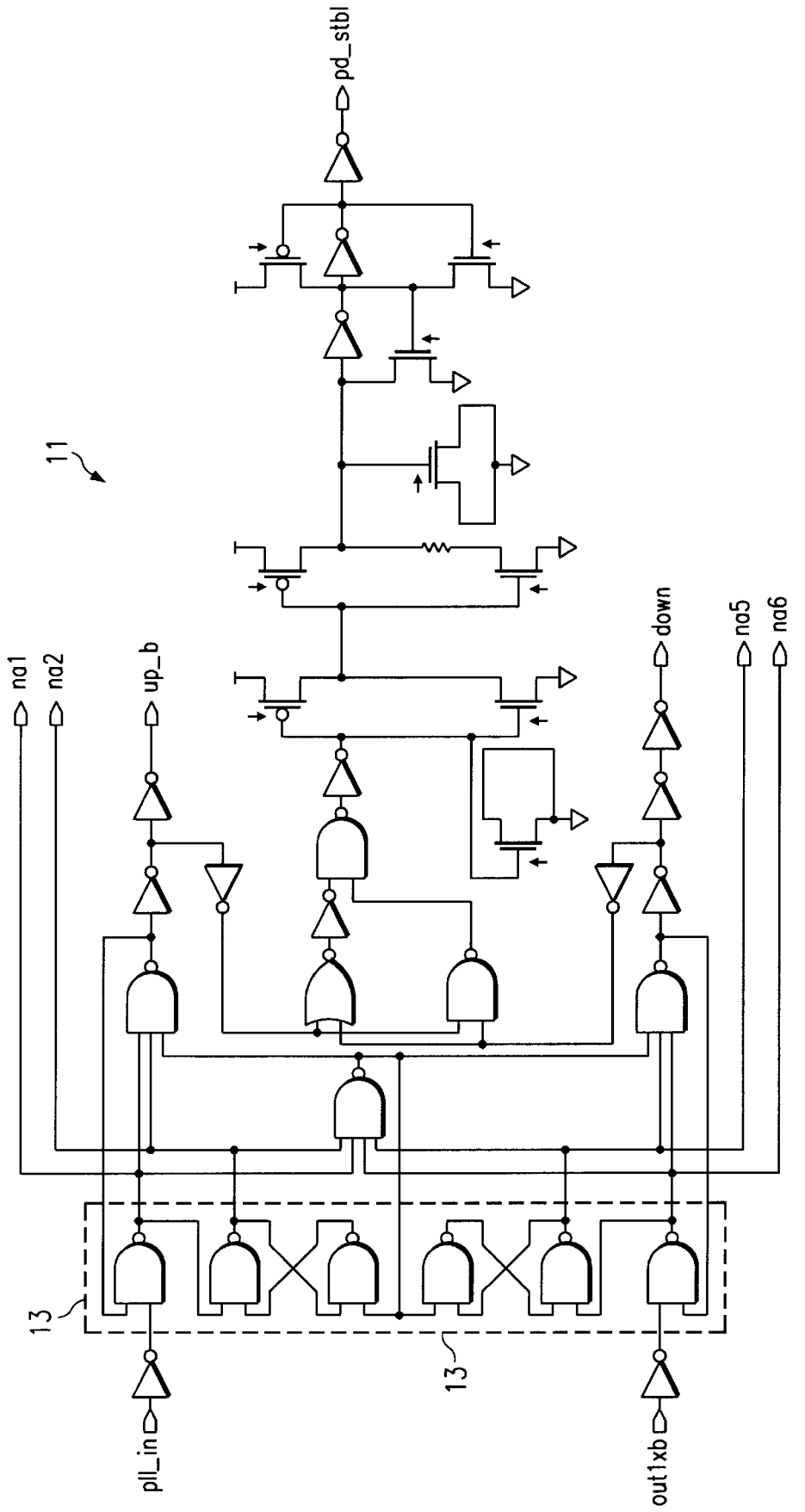
FIG. 2 is a schematic of the first portion of the phase detector of the preferred embodiment.
Figure 3:
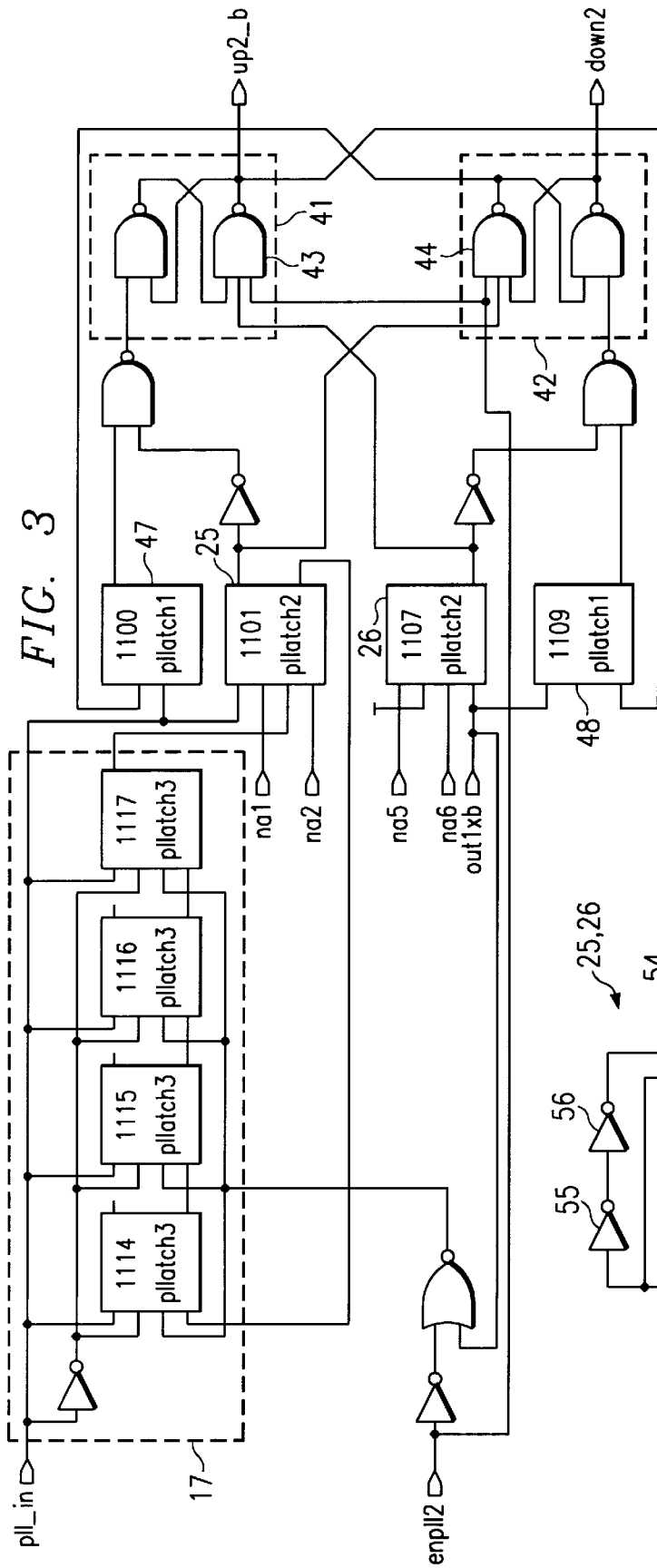
FIG. 3 is a second portion of the phase detector of the preferred embodiment connecting to said first portion.

Referring to FIGS. 2–3, the phase detector 11 includes logic circuitry 13, single cycle or main detector circuitry 14, and two-cycle detector circuitry 16. The logic circuitry 13 provides control signals na1, na2, na5, na6 where na1 and na6 provide a coarse indication of slipping a cycle and na2 and na5 provide the exact information as to whether the phase detector slips a cycle. In the prior art that information is lost. The two-cycle detector circuitry 16 includes latch circuitry 17 providing a control signal indicating cycle slippage on start-up, a cycle controller 19 generating master pulses controlling the state counter upon detection of a phase difference greater than or equal to a cycle, and a three state counter 21 sending the phase adjustment signal, the phase adjustment signal comprising an increment, neutral or decrement signal.

The logic circuitry 13 comprises multiple NAND gates. The latch circuitry 17 comprises multiple latches connected in serial relation.

The cycle controller 19 includes latch circuitry 25, 26 disposed in tandem relation for outputting respective up and down cycle master pulses.

The three state counter 21 includes up-state circuitry 41, providing a phase difference greater than one cycle-up pulse, down-state circuitry 42 providing a phase difference greater than one cycle-down pulse and, increment control logic 47 and decrement control logic 48 (depicted in FIG. 4) for controlling said up-state and down-state circuitry 41, 42.

The up-state and down-state circuitry 41, 42 respectively receive portions of the master pulse from each of the latch circuitry 25, 26. In the case of an increment master pulse, the increment pulse clears the down-state circuitry 42 and is delivered as an input to the 3-input NAND of up-state circuitry 41; whereas, the analogous operation occurs with a decrement pulse.

Figure 5:
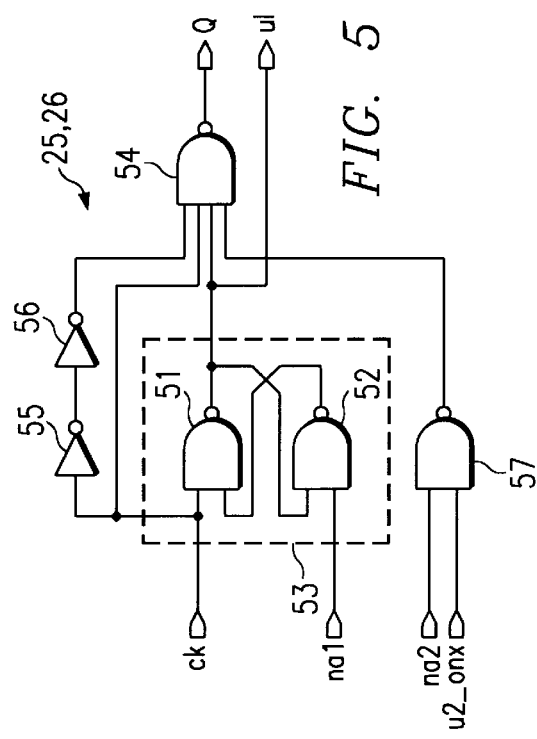
FIG. 5 is a schematic of latch 25 and 26 in the preferred embodiment.

Referring to FIG. 5, the latch circuitry 25, 26 includes NAND gates 51, 52 which are hooked to develop a latch circuit 53 for receiving the pll-in and na1 signal and emitting signal U1 to 4-input NAND gate 54, inverters 55, 56 deliver a delayed reference clock signal to NAND 54, and NAND gate 57 sends signal of cycle slip to NAND 54. When NAND 54 has all positive inputs the signal Q is emitted as the master control pulse.

Referring to FIG. 6, the charge pump comprises a cascoded current source 61 providing a reference current, a cascoded current mirror 63 providing output 65, 67 for respectively driving down-reference voltage generator 69 and cascoded current mirror 71, cascoded current mirror 71 driving up-reference voltage generator 73, and, single and double cycle current sources 75, 77 together providing output current pulses to node PCTRL 79. Up-reference voltage CMP 81 delivered by up-reference voltage generator 73 determines the magnitude of the current provided by up-transistor 83 and UP2-transistor 84. Analogously, up-reference voltage CMN 85 determines the magnitude of the current provided by DOWN-transistor 87 and DOWN2-transistor 88. When control input signals UP-B and DOWN2 are both low, the output of NOR gate 89 goes high delivering an UP output current through transistor 83 to output node PCTRL 79, where the magnitude of the current pulse is defined by transistor 83. Analogously, NOR 91 functions with transistor 84 to provide UP2 cycle current. Similarly, NAND gates 93, 95 function with transistor 87, 88 respectively with high inputs to said NAND gates 93, 95.

Transistor 84, 88 gate lengths are shorter than transistor 83, 87 gate lengths in order to provide larger UP2 and DOWN2 currents than UP and DOWN currents, respectively.

Capacitors 97, 99 are included to provide stability to voltages 81, 85.

Referring to FIG. 7, the loop filter includes resistor circuitry 101 and capacitor circuitry 103 connecting to said resistor circuitry 101. The loop filter provides capacitance converting current pulses to an output voltage, where said output voltage is provided to the OPAMP for setting the control voltage of the VCO (shown in FIG. 7) where the specific implementation is hereby incorporated to by reference to co-filed application patent pending number TI-18511.

Figures 8, 9:
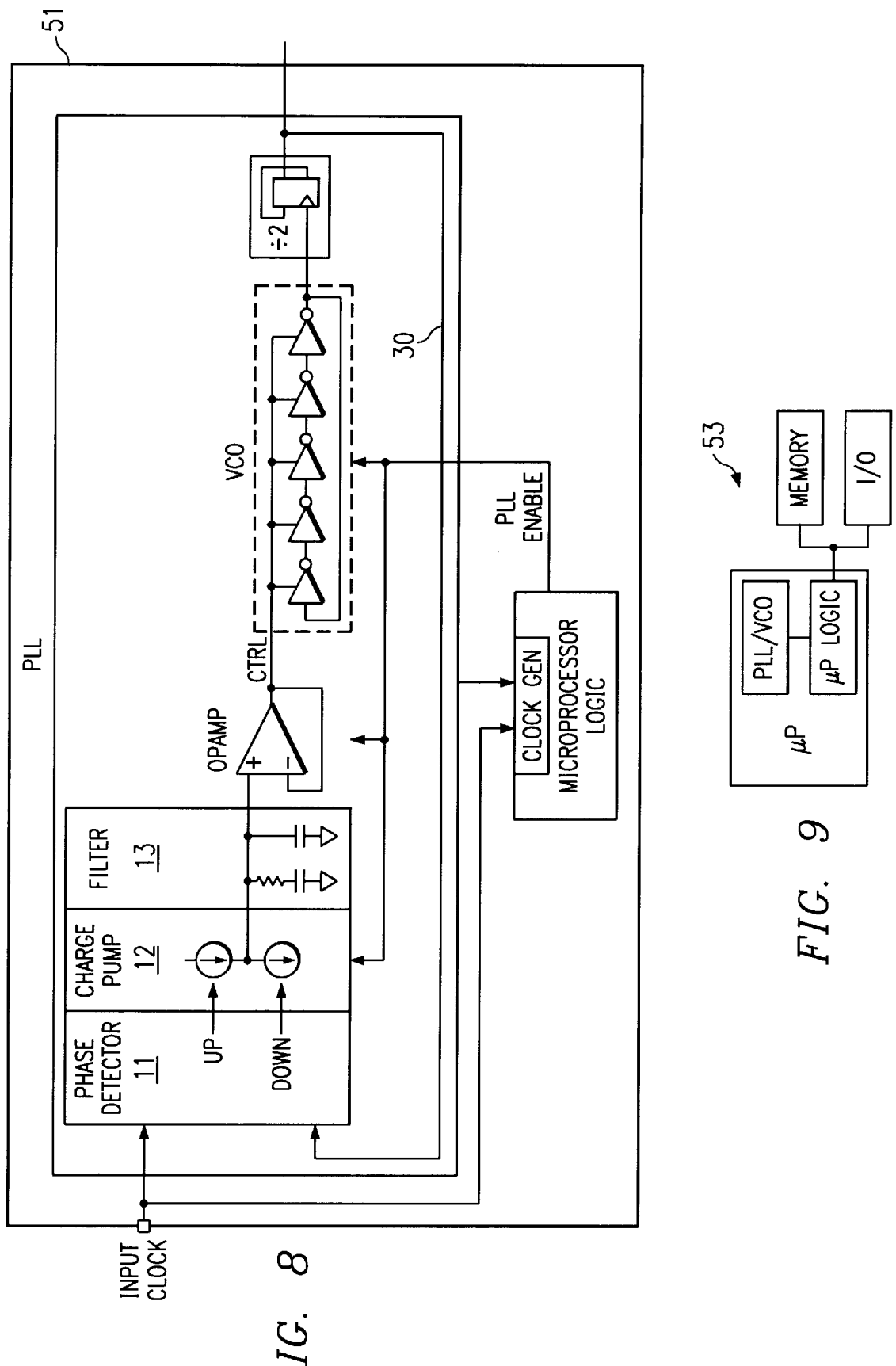
FIG. 8 is a block diagram of the phase-locked loop circuit of the preferred embodiment integrated in a processor.
FIG. 9 is a block diagram of a processing system including the phase-locked loop circuit of the preferred embodiment of the present invention.

Referring to FIG. 8, the PLL is shown implemented with a processor.

Referring to FIG. 9, the PLL is shown implemented in a processing system.

The Problem:

Phased-locked loops (PLL's) are feedback circuit with a certain gain-bandwidth product. In simplified form, that gain-bandwidth product is typically the charge pump and loop filter gain times the VCO gain. The gain can be straightforwardly set to any desired value typically by setting the magnitude of a current source which drives the charge pump and loop filter. Practically speaking, there is a maximum allowed value for the gain-bandwidth product, and therefore the current source, which is related to the lowest input clock frequency which the PLL wants to lock to.

One operation required of a PLL is acquisition. When the PLL is first powered up, the output control voltage of the loop filter may be zero, and therefore the VCO will not oscillate at all. Then the PLL is powered on, and a 50 MHz input clock (for example) is presented to the phase detector. The phase detector and charge pump must slew the output voltage of the loop filter upwards to a sufficient value so that the VCO oscillates at the correct frequency. The time it takes to do this is partially determined by the setting of the magnitude of the current source reference for the charge pump. The smaller the current source, the longer the acquisition time. It is desired to increase the value of this current source to minimize acquisition time, but there are limits to this, as described in the paragraph above, since the gain-bandwidth product of the PLL is directly proportional to the value of the current source, and the allowable gain-bandwidth product is limited.

A circuit which could get around these limits would be a useful feature in a PLL, because it could reduce the acquisition time, while not disturbing the PLL's gain-bandwidth product.

Introduction:

Acquisition time in a typical prior art PLL can be broken up into two portions: in the first portion, the phase detector is basically saturated, the phase difference between the input and PLL clock is larger than a clock cycle, the PLL is slipping clock cycles, and the charge pump is slewing the loop filter capacitor upwards as fast as it can. Eventually it gets the VCO control voltage to about the correct value for proper frequency oscillation, and the PLL stops slipping clock cycles. Then it enters the second portion of the acquisition time, where it is settling in, and the PLL phase error decreases exponentially with a time constant equal to that of the zero in the main loop filter. This invention reduces the first portion of the acquisition time, but does not substantially affect the second portion.

Figure 1A:
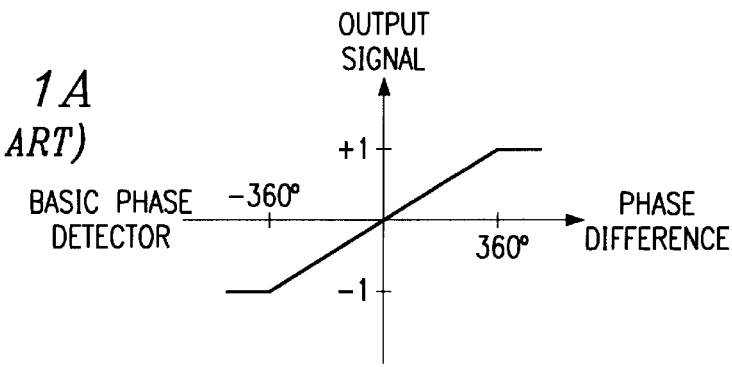
FIG. 1A is a phase difference characteristic curve of the prior art.
Figure 1B:
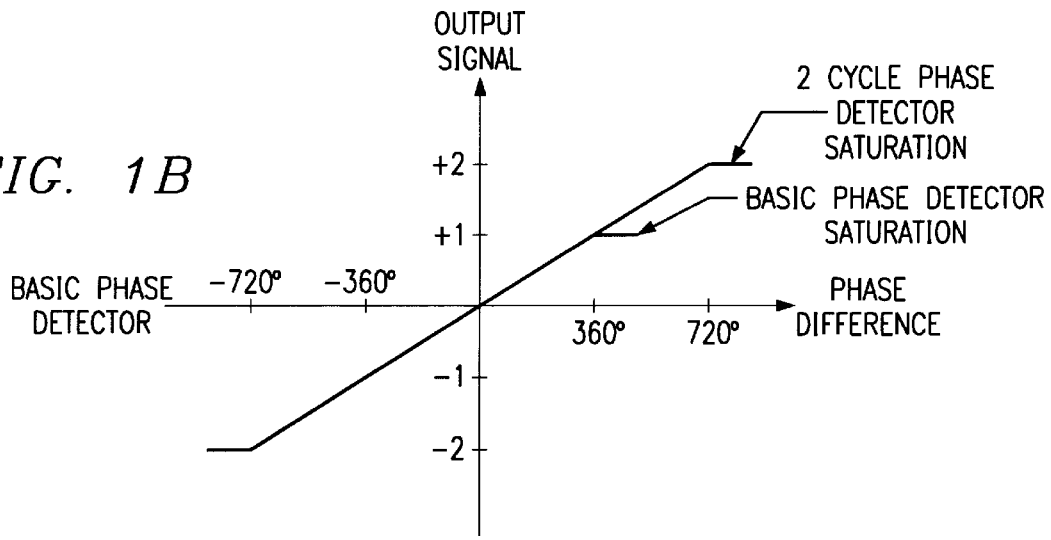
FIG. 1B is a phase difference characteristic curve of the preferred embodiment of the present invention.

The PLL incorporates an addition to the phase detector which allows detection of phase differences up to two complete clock cycles. FIG. 1A shows the transfer function of a basic phase detector. It is linear until it saturates at plus or minus one cycle of phase difference, 360 degrees. The two-cycle phase detector of FIG. 1B extends the linear region by 2X, so that it saturates at twice the output current, without increasing the gain-bandwidth product by the PLL. This reduces the first portion of the acquisition time by about a factor of two. This feature will be described in the section on the two cycle phase detector.

The charge pump incorporates a circuit which further increases the output current available to the loop filter.

Figure 1C:
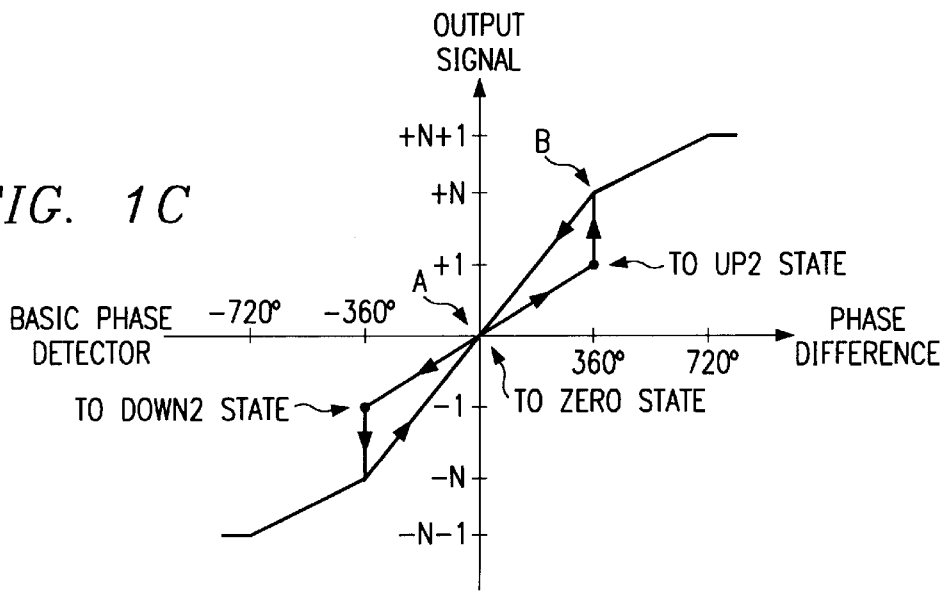
FIG. 1C is a characteristic curve of the signals from the phase detector and charge pump of the preferred embodiment.

The combined phase detector charge-pump transfer function is shown in FIG. 1C. It is similar to FIG. 1B in that it saturates at 2 cycles of phase difference, but it differs in that it has higher gain portions of the curve and hysteresis. This feature will be described in the section on the charge pump.

The Basic Phase Detector:

The basic phase detector is the classical design which has been in use for a number of years. It is shown in FIG. 2.

The Two-Cycle Phase Detector:

In the PHASECOMP3 schematic of FIG. 3, two NAND-gate latches 41 and 42 at the far right together form a three-state output, up2, zero, down2. This can be considered a three-state counter, and will be incremented or decremented by the circuits to its left. The top latch 41 is on to signal UP2_B, the bottom latch 42 is on to signal DOWN2, and both are off to signal zero. The third inputs on the three input NAND gates 43 and 44 are fed from the ENPLL2 signal, resetting the three-state counter to the zero state whenever the PLL is disabled. The UP2_B and DOWN2 outputs drive extra current sources in the charge pump, and are turned on when the phase difference exceeds a full clock cycle.

Figure 4:
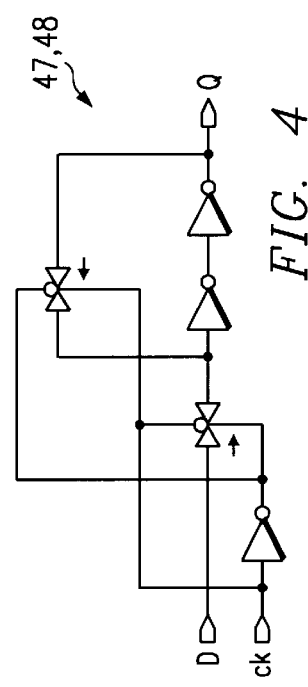
FIG. 4 is a schematic of latch 47 and 48 of the preferred embodiment.

In the middle of the schematic, the two instances of PLLATCH2 25 and 26 generate the master pulses which control the state machine and increment or decrement the three-state counter. The top PLLATCH2 25 generates a pulse whenever the phase detector detects losing a complete clock cycle in the upward direction (for incrementing), while the bottom PLLATCH2 26 detects losing a clock cycle in the downward direction (for decrementing). The upward PLLATCH2 25 output pulse turns off DOWN2, and turns on UP2_B only if DOWN2 was not previously on (the previous state of DOWN2 is remembered by the upper PLLATCH1 latch 47). Similarly, the bottom PLLATCH2 26 output pulse turns off UP2_B and turns on DOWN2 only if the previous UP2_B was off, with the previous state of UP2 being remembered by the bottom PLLATCH1 48. The PLLATCH1 circuit is shown in FIG. 4.

The heart of the two cycle detector circuitry 16 is circuitry for generating the incrementing and decrementing pulses, the two instances of the PLLATCH2 circuit, shown in FIG. 5. There is a cross-coupled pair of NAND gates 51 and 52 forming a latch, which records the state of the NA1 input when the clock input (PLL_IN on the FIG. 2 schematic) rises. Normally, NA1 will be low in the second half of the clock cycle, after the other clock OUT1XB has arrived. However, if the OUT1XB signal is late enough, and lags the PLL_IN clock by a full clock cycle, it will not have switched NA1 low by the time PLL_IN rises, and the cross-coupled latch of the PLLATCH circuit will have a high output. That is AND'ed with the clock by AND gate 54 to produce a pulse only enabled during the clock high time. A version of the clock delayed by two inverters 55 and 56 is also AND'ed in, because in the normal case of smaller than a full clock cycle phase shift between the two PLL input clocks, there is a small delay from the clock rising to the output of the NAND-latch 53 falling, and the delayed clock prevents small glitches from occurring at the output of the four-input NAND 54 which generates the Q output.

This NAND-latch 53 output is a necessary, but not sufficient condition to gate the output pulse which indicates slipping a cycle. The sampling of NA1 by the clock is not exactly synchronized with the action of the main phase detector of FIG. 2, which in the case of inputs which are very close to slipping a cycle, actually makes the decision by going to a metastable state and eventually resolving it. So only by observing the proper state of the main phase detector can an accurate decision be made about when it has slipped a cycle; it is impossible to duplicate in another circuit the exact resolution point of the metastable decision making circuit. The additional two input NAND gate 57 at the bottom of FIG. 5 is provided for that purpose. This NAND gate 57 passes an inverted version of the NA2 signal as an enable to the four input NAND gate 54. The function of the NA2 signal in the phase detector of FIG. 2 is as follows: in normal operation, when the OUT1XB clock is more than half a cycle behind the PLL_IN clock, the NA2 signal goes low for a very short pulse on the rising edge of OUT1XB, then recovers high. However, if OUT1XB is a full cycle late, then it does not go high, and the state of the phase detector is altered such that it has essentially lost the OUT1XB clock edge and slipped a cycle. By using the still low value of NA2 to gate the PLLATCH2 output signal, it accurately reflects when the main phase detector slips a cycle.

This circuit will work correctly when a cycle is slipped, but when a PLL starts up, often the PLL_IN clock will run many cycles before the OUT1XB even starts oscillating. In that case, the PHASECOMP3 circuit will not turn on the UP2 signal until the first edge of OUT1XB. To fix that case, a small shift register 17 has been provided, which shifts in a high value on the PLL_IN clock, but resets it on the first DOWN pulse, which occurs on the first edge of OUT1XB. If it is not reset in time, it outputs a signal to the upper PLLATCH2 circuit 25, which also indicates the slipping of a clock cycle.

It is easy to extend this phase detector to be linear over more clock cycles than two. The three-state counter on the right simply has to be extended to more states, like UP3, UP2, ZERO, DOWN2 and DOWN3, for a three-cycle phase detector. This would output additional signals UP3 and DOWN3 to the charge pump to drive additional current sources.

In practice, the simple phase detector of FIG. 2 cannot recognize a full clock cycle of phase difference due to logic delays in its gates; rather it saturates at a slightly smaller phase difference. The amount of reduction of range increases with increasing clock frequency, and is proportional to the ratio of the phase detector's gate delays to the clock period. The effect of this is to slightly modify the transfer functions of FIG. 1, but it does not change the principle of operation of the multi-cycle phase detector.

The Charge Pump:

The charge pump 12 shown in FIG. 6 includes two current sources which drive the output signal PCTRL at the right. One pulls up through transistor 83, controlled by the UP_B input control signal, while the other pulls down through transistor 87, controlled by the DOWN input control signal. The gates of transistors 87 and 83 are tied to voltage references CMN 85 and CMP 81 respectively, created by current mirrors 63 and 71 respectively, which determine the values of the up and down currents. Filter capacitors made of MOS transistors 97 and 99 are placed on the voltage reference signals. When both current sources are on, the currents are subtracted in the analog domain, so that the output is approximately zero. Every clock cycle, there will be short UP_B and DOWN pulses.

The currents are switched on and off by driving the sources of transistors 87 and 88, through NAND gates 93 and 95, respectively and by driving the sources of transistors 83 and 84 through NOR gates 89 and 91, respectively,. When the source of transistor 87 is low, transistor 87 is on, and it can be quickly turned off by raising its source to a high voltage. There are various different ways of building and controlling current sources, and it is understood that use of different styles of current sources does not affect the operation of the multi-cycle charge pump which is described below.

At the left side, references VBN1 and VBN2 come in and drive a current source 61, which has other current source transistors in parallel to it, which can be connected on the metal2 layer to increase the bias current level. This current source drives a p-channel current mirror 63, where again parallel transistors are provided, but in this case, connecting them will reduce the overall reference current level. The reference voltage established by the p-channel transistors ultimately determines the value of the current source outputs, through additional current mirrors.

There is a second set of current sources formed by transistors DM1 84 and DM2 88 also connected to the output signal PCTRL. These add extra current, as controlled by UP2_B and DOWN2, for phase detection linear over two clock cycles of phase difference. The extra current provided by this second set of current sources decreases acquisition time when the VCO control voltage PCTRL has to be slewed by a large amount.

The sources of the p-channel current source transistors POP5 83 and DM1 84 are controlled by NOR gates 89 and 91, while the sources of the n-channel transistors 87 and 88 are controlled by NAND gates 93 and 95. This accomplishes subtraction of some of the up versus down currents in the time domain rather than in the current domain, which in some cases is required for correct operation. The reason for this is as follows: assume for this discussion that the magnitudes of the UP 83, DOWN 87, UP2 84 and DOWN2 88 current sources are all equal. When the phase detector indicates that the PLL has slipped by more than one cycle, the UP2_B or DOWN2 signal is asserted. It remains asserted until the PLL slips a cycle in the opposite direction. In other words, if UP2 is on and provides a current of +1 to the output, the phase detector may have the DOWN signal on for a large fraction of the clock cycle (such as 75%) as the phases of the two signals converge, so that the average down current is 0.75, resulting in a net up current of 0.25. When the averaged down current approaches 1, the PLL will slip the cycle in the opposite direction, and then UP2 will go off, and DOWN will go from on almost the full clock cycle, to almost zero phase difference, and on for only a short time. A problem with this scheme occurs if the UP2 versus DOWN currents are subtracted in the analog domain. Because the output current sources are not cascoded, they are not perfectly accurate, and if they are not equal, the PLL can stabilize with UP2 or DOWN2 asserted. For example, if UP2 is asserted, and PCTRL is near VDD, the UP2 current value will be relatively smaller because of the small voltage drop across the UP2 current source transistor DM1 84 (small VDS). On the other hand, the VDS across NOP4 87, the DOWN current source transistor, will be large, and its current will be correspondingly larger. With a 5% mismatch in the values of the currents, DOWN might have a time-averaged current equal to that of UP2 with only 95% duty cycle, and the PLL would be in a quiescent state. Unfortunately, with the DOWN signal on a substantial fraction of the time, the PLL would be indicating unlock.

This problem is solved by the NAND and NOR gates 89, 91, 93 and 95 driving the current sources. UP2 transistor 84 is only driven when DOWN is off, and DOWN transistor 87 is only driven when UP2 is off. When both opposing control signals UP2_B and DOWN are asserted, both current sources 84 and 87 are turned off. Similarly, DOWN2 transistor 88 is only driven when UP is off, and UP transistor 83 is only driven when DOWN2 is off. When both opposing control signals DOWN2 and UP_B are asserted, both current sources 83 and 88 are turned off.

There is a feature in the second set of current sources (UP2 84 and DOWN2 88) which further reduces loop acquisition time when large voltage swings on PCTRL are required. Note that while the lengths of the current source reference transistors and the UP and DOWN current source transistors POP5 83 and NOP4 87 are 2.5 u, the length of the UP2 and DOWN2 transistors 84 DM1 and DM2 88 is 1.25 u. This increases the value of the up2 and down2 current sources by approximately a factor of 2, further increasing the maximum available charging current. The transfer function of the combined phase detector and charge pump is shown in FIG. 1C, where the value of the UP and DOWN current sources is called 1, and the value of the UP2 and DOWN2 current sources is N. As the phase difference increases from 0, the UP current source 83 is on with proportionally larger duty cycles, approaching 100% duty cycle as the phase difference approaches 360 degrees. Let us call this a gain of 1. When the phase detector slips a cycle, the UP current source 83 goes from 100% to approximately 0% duty cycle, and the UP_2 current source 84 goes on. This makes the output jump by the difference in the magnitudes of the UP and UP2 current sources. As the phase difference further increases, the UP current source 83 duty cycle increases, and the incremental gain of the phase detector is again 1. If after slipping a cycle the phase difference drops from 360 degrees back towards 0 degrees, the DOWN control signal is on with a proportionally larger duty cycle. The action of this is to reduce the duty cycle of the UP2 current source 84. The DOWN current source 87 never turns on as long as UP2_B is asserted. The incremental gain of the phase detector is N when the phase detector is in the UP2 state.

The process of acquisition has four phases. The first phase starts with the control voltage PCTRL at zero, and continues as the voltage ramps up until the VCO starts oscillating. During that time, both UP2 84 and UP 83 are on 100% of the time, and the total available current is 300% of the reference current (100% from UP and 200% from UP2). The second phase starts when the VCO starts oscillating, and continues until the PLL reaches the linear region of acquisition; that is, until it is no longer losing cycles and starts converging on the phase difference. During the second phase, the phases of the input clock and VCO clock are essentially random with respect to each other, and in the absence of the 2 cycle phase detector, the available charging current is reduced from 100% of the reference level because of the duty cycle variations of the UP control signal. With the two cycle detector, UP2 84 is always on, DOWN 87 has only a short pulse each VCO clock cycle, and UP 87 is on a random fraction of the time. During this phase, the available charging current is close to 300% of the reference current.

The third phase of acquisition is when the PLL is no longer slipping cycles, in this case when the VCO never lags the input clock by more than two clock cycles. It lasts until the phase detector comes down out of the two cycle state. During this third phase, UP2 84 is on, UP 83 is on only for a short pulse each clock cycle, and DOWN 87 is on an increasing fraction of the time. When DOWN 87 is on almost 100% of the time, the PLL has come to almost the correct phase, with UP2 84 on saying +1 cycle, and DOWN 87 on almost all the time saying almost −1 full cycle. As the duty cycle of DOWN increases, it reduces the duty cycle of the UP2 current source 84, and since UP2 is on, the down current source 87 never comes on. So during this phase, the duty cycle of the UP2 current source 88 reduces from 100% to 0%. In this phase, the phase difference diminishes with a time constant equal to the loop zero time constant.

The fourth phase starts when the PLL is close to phase alignment, when the phase detector drops out of the UP2 state, and continues until the PLL output is fully aligned. The phase difference diminishes with a time constant equal to the loop zero time constant.

The increased current level of the UP2 and DOWN2 current sources 84 and 88 produces hysteresis in the phase detector transfer function, as shown in FIG. 1C. When the phase difference starts at 0 and increases, the two cycle phase detector is in the zero state (as opposed to UP2 or DOWN2). The transfer function is linear and identical to FIG. 1A, the transfer function of the basic phase detector. When the phase difference reaches 360 degrees, the PLL has slipped a cycle, and the phase detector goes to the UP2 state. At that point, the UP2 current source 84 turns on with a value twice that of the UP current source 83, so there is a jump discontinuity in the phase detector transfer function, as shown in FIG. 1C. If the phase difference continues to increase, the UP current source 83 turns on with some duty cycle, extending the transfer function out to 720 degrees. On the other hand, if the phase difference decreases from 360 degrees, the DOWN signal actually just turns off the UP2 current source 84 during the portion of the clock cycle when DOWN is on. So the duty cycle of the UP2 current source 84 decreases from 100% at 360 degrees of phase difference, to 0% at 0 degrees of phase shift. When the phase difference reaches 0, the PLL slips a cycle in the downward direction and goes back to the zero state and the original transfer function. If the phase difference goes in the negative direction, operation is similar, with the transition to the DOWN2 state occurring at a phase difference of −360 degrees. Note that the transitions to the three states are marked, and the phase detector can stay in each state for a range of plus or minus 360 degrees about the point where it entered that state. After that, a state transition occurs.

In actuality, the state transitions do not occur at exactly 360 degrees, but at something less than that. The basic phase detector actually has a range slightly less than 360 degrees because of finite logic gate delays.

The Loop Filter:

The loop filter, shown in FIG. 7, is composed of two MOS capacitors and one well resistor. The large capacitor is about 37 pf. The well resistor is about 10K ohm at room temperature, leading to a loop zero at about 370 ns. The other MOS capacitor is about 1.5 pf. This is parallelled by the well capacitance of the well resistor, so the second pole's time constant will be somewhat longer than 15 ns. These poles are comfortably outside the range of the loop crossover frequency, which has a time constant ranging from 90 ns to 170 ns.

While this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is therefore contemplated that the appended claims will cover any such modifications or embodiments as fall within the true scope of the invention.

What is claimed is:

1. A phase-locked loop circuit for locking the phase of an oscillator output signal to the phase of a reference signal, comprising:

a phase detector for detecting a phase difference between an input signal and said reference signal through multiple clock cycles, and for providing a first phase detector output signal representative of a detected phase difference less than a single cycle, and for providing a second phase detector output signal representative of a detected phase difference greater than a single cycle;

control means, receiving said first phase detector output signal and said second phase detector output signal, for providing a voltage controlled oscillator (VCO) control signal controlled by said first phase detector output signal and said second phase detector output signal;

a voltage controlled oscillator receiving said VCO control signal and providing said oscillator output signal which is applied to said phase detector as the input signal thereof.

2. A phase locked loop as in claim 1 wherein said control means comprises:

a first control signal source, responsive to said first phase detector output signal, providing a first control signal representative of a phase difference between said reference signal and said input signal less than a single cycle; and a second control signal source, responsive to said second phase detector output signal, providing a second control signal representative of a phase difference between said reference signal and said input signal greater than a single cycle.

3. A phase locked loop as in claim 1 wherein said control means comprises:

a charge pump responsive to said first and said second phase detector output signals and for providing a charge pump output signal; and a loop filter responsive to said charge pump output signal and providing a filtered output signal.

4. A phase locked loop as in claim 3 wherein said charge pump comprises:

a first current source responsive to said first phase detector output signal for outputting a first current; and a second current source responsive to said second phase detector output signal for outputting a second current.

5. A phase locked loop circuit for locking the phase of an oscillator output signal to the phase of a reference signal, comprising;

a phase detector for detecting a phase difference between an input signal and said reference signal through multiple clock cycles, and for providing a first phase detector output signal representative of a detected phase difference less than a single cycle, and for providing a second phase detector output signal representative of a detected phase difference greater than a single cycle;

control means, receiving said first phase detector output signal and said second phase detector output signal, for providing a voltage controlled oscillator (VCO) control signal controlled by said first phase detector output signal and said second phase detector output signal, wherein said control means comprises:

a first control signal source, responsive to said first phase detector output signal, providing a first control signal representative of a phase difference between said reference signal and said input signal less than a single cycle, and a second control signal source, responsive to said second phase detector output signal, providing a second control signal representative of a phase difference between said reference signal and said input signal greater than a single cycle, a charge pump responsive to said first and said second phase detector output signals and for providing a charge pump output signal said charge pump comprising a first current source responsive to said first phase detector output signal for outputting a first current, and a second current source responsive to said second phase detector output signal for outputting a second current, and a loop filter responsive to said charge pump output signal and providing a filtered output signal; and a voltage controlled oscillator receiving said VCO control signal and providing said oscillator output signal which is applied to said phase detector as the input signal thereof; and wherein said phase detector provides said first phase detector signal as duty cycle modulated pulses.

6. A phase locked loop as in claim 5 wherein:

said phase detector further comprises a latch, settable upon detection of a slippage of a cycle and resettable upon detection of a slippage of a cycle in a opposite direction of slippage causing a set of said latch, and said second phase detector output signal is the output of said latch.

7. A phase locked loop as in claim 6 wherein:

said phase detector further comprises means for cancelling digitally said second phase detector output signal during the time said first phase detector output signal is active.

8. A phase locked loop as in claim 6, wherein the first control signal and and the second control signal are provided each at a predermined level, active during the time the first phase detector output signal and the second phase detector output signal, respectively, are active.

9. A phase locked loop as in claim 8, wherein the predetermined level of said second control signal is substantially larger than the predetermined level of said first control signal.

10. A phase locked loop as in claim 6 wherein:

said phase detector further comprises means for cancelling digitally said second phase detector signal during the time said first phase detector output signal is active;

the first control signal and the second control signal are provided each at a predermined level, active during the time the first phase detector output signal and the second phase detector output signal, respectively, are active; and the predetermined level of said second control signal is substantially larger than the predetermined level of said first control signal.

11. A phase locked loop as in claim 8, wherein the predetermined level of said second control signal is substantially the same as the predetermined level of said first control signal.

* * * * *